United States Patent [19]

Morozumi

[11] Patent Number: 4,934,054
[45] Date of Patent: Jun. 19, 1990

[54] CUTTING DEVICE FOR MASKING FILM
[75] Inventor: Kunio Morozumi, Yamanashi, Japan
[73] Assignee: Kimoto & Co., Ltd., Japan
[21] Appl. No.: 280,449
[22] Filed: Dec. 6, 1988
[30] Foreign Application Priority Data Jul. 7, 1988 [JP] Japan .............................. 63-89432[U]

[51] Int. Cl.$^5$ ............................................... B26B 3/00
[52] U.S. Cl. ........................................ 30/293; 30/294; 30/315; 33/27.12
[58] Field of Search .................. 30/290, 294, 289, 293, 30/315, 317, 310; 33/27.01, 27.04, 27.12, 28, 30.3, 30.5, 32.1–32.3; 83/925 CC; 132/73.5

[56] References Cited

U.S. PATENT DOCUMENTS

| 623,227 | 4/1899 | Veronese | 33/27.04 |
| 1,056,353 | 3/1913 | Moore | 33/28 |
| 2,557,500 | 6/1951 | Fairbanks | 33/27.01 |
| 2,996,803 | 8/1961 | Saltz et al. | 33/27.01 |
| 3,503,160 | 3/1970 | Gury | 83/925 CC |
| 3,772,955 | 11/1973 | Pearl | 83/925 CC |
| 3,994,194 | 11/1976 | Moceri | 30/310 |

FOREIGN PATENT DOCUMENTS 2154872  9/1985  United Kingdom ............... 132/73.5

Primary Examiner—Frank T. Yost
Assistant Examiner—Eugenia A. Jones
Attorney, Agent, or Firm—Lorusso & Loud

[57] ABSTRACT

This invention provides a cutting device used in making a cut mask, which includes a hollow frame with a lower flat sliding surface and a cutter supported rotatably and with tension by a supporting arm secured to the frame, with the point of the cutting edge of the cutter being offset from the axis of rotation of the cutter that is orthogonal to the lower sliding surface, and which makes it possible to hold the cutter constantly at a set angle under a certain pressure, thereby facilitating the work of cutting.

7 Claims, 4 Drawing Sheets

CUTTING DEVICE FOR MASKING FILM

BACKGROUND OF THE INVENTION

1. Field of the Invention

This invention relates to a cutting device used in making a cut mask for photoengraving.

2. Related Art Statement

Hitherto, the work of making a cut mask for photoengraving was achieved by superposing a mask film on an original photo and moving a cutter along the outline of the image on the photo so that a cut mask identical with the original could be made.

However, when this work was carried out by a worker holding an ordinary cutter in hand, the pressure on the cutter was not constant. It was difficult to hold the cutter constantly at the same angle. The angle of the cutting edge varied; thus, it was not easy to make a precise cut mask quickly and accurately.

The objective of the present invention is to provide a cutting device used in making a cut mask which enables anyone not skilled to make a cut mask for photoengraving to do so easily and accurately, that was heretofore difficult to do.

Another objective of the present invention is to provide a cutting device to make a cut mask which permits adjustment of the pressing force of the cutter against a mask film as required so that the work of the cutting can always be achieved easily, finely and satisfactorily.

SUMMARY OF THE INVENTION

The above-described drawbacks in the prior art devices have been successfully eliminated by the present invention.

The cutting device used in making a cut mask according to the present invention comprises a frame of hollow cylindrical shape having a lower flat sliding surface, a supporting arm secured to the frame whose distal end extends to the central area of the frame; a rotating cutter supported by a cutter supporting member secured to the distal end of the supporting arm with its axis of rotation orthogonal to the lower sliding surface; and resilient means for resiliently supporting the cutter vertically, wherein the cutter has a cutting point which is offset sideways from the axis of rotation.

As a preferred feature, a magnifying lens is attached with a curvature-adjustable supporting rod to a curved portion of the cutter supporting arm at a position where the work is not hindered. The pressing force of the cutter against the work is made adjustable with a coiled spring and an adjusting screw provided in the upper portion of the cutter attaching member.

These and other objectives of the invention will become apparent from the following description of the essential parts when taken together with the drawings.

BRIEF DESCRIPTION OF THE DRAWINGS

FIGS. 1 through 3 show a first embodiment of the device according to the present invention in which:

FIG. 1 is a front view with the important portion shown in cross section;

FIG. 2 is a plan view; and

FIG. 3 is a front view with the important portion including a different cutter shown in cross section; and FIGS. 4 through 7 show a second embodiment of the present invention in which:

FIG. 4 is a side view;

FIG. 5 is a front view;

FIG. 6 is a sectional view of the cutter supporting member; and

FIG. 7 is a set of enlarged views showing the configuration of the cutter in which (a) is a side view, (b) a front view, and (c) a bottom view.

DETAILED DESCRIPTION OF THE PREFERRED EMBODIMENTS

Figure 1:
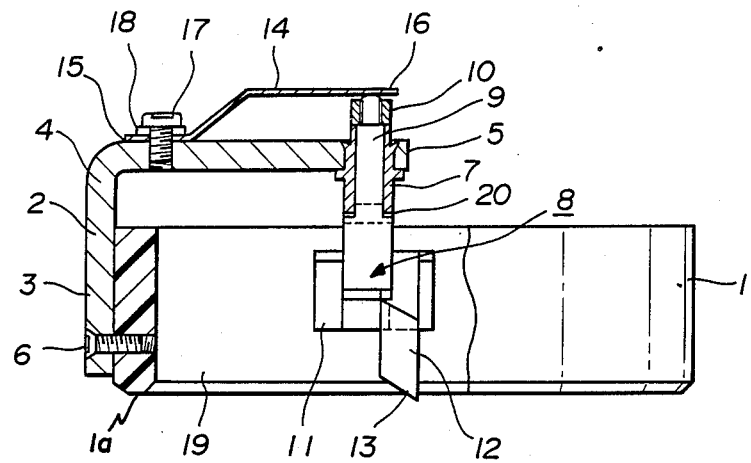

In FIG. 1, 1 is a frame of hollow cylindrical shape which has a lower flat sliding surface. The outer periphery of this frame 1 is about 6 cm in outer diameter and holds an inverted L-shaped supporting arm 2 made of aluminum whose base end portion 3 is secured to it on one side with a setscrew 6. The distal end portion 5 of this arm extends to and above the central area of the hollow 19 defined by frame 1. This distal end portion 5 supports a rotatable bearing in which is rotatably and slidably supported a shaft 9 for a cutter 8 whose axis of rotation is orthogonal to the lower sliding surface 1a of the frame 1.

The cutter 8 holds two blade supporting plates 11 inserted in a lower split portion of the supporting shaft 9 by means of a setscrew tightened horizontally. Specifically, a blade piece 12 is pinched and held between the two blade supporting plates 11, offset sideways with respect to the axis of rotation of the cutter 8.

The upper end of the supporting shaft 9 has a nut 10 tightened thereto, the lower surface of this nut 10, defining a shoulder portion, is supported by the upper end of the bearing 7. The lower end of the bearing 7 and an intermediate stepped portion of the supporting shaft 9 are dimensioned so as to leave a slight gap 20 therebetween. The blade piece 12 is prepared by folding a commercially available, notched plate-like cutter blade element and separating one piece therefrom, and is supported as shown such that its cutting point 13 projects about 1 mm below the lower surface of the frame 1.

The upper surface portion of the supporting arm 2 in the vicinity of its curved portion 4 holds the base end 15 of a spring plate 14 secured thereto with a washer 18 and a lock bolt 17, and the distal end 16 of the spring plate 14 bears against an upper ball-shaped portion of the supporting shaft 9, so that the cutter 8 as a whole is pushed downward.

Thus, in this embodiment, the cutter 8 is pushed by the spring plate 14 with a pressure of about 20 g, but can turn freely about the central axis of the supporting shaft 9.

When cutting, the device is positioned, or the cutting point 13 of the cutter 8 is placed on the mask film superposed on an original photo while visually aligning, through the hollow portion 19 of the frame 1, the cutting point with the starting position for cutting, and then the work is started by causing the cutting point 13 to cut into the film.

In the course of proceeding with the cutting, it is possible to observe the original photo and the position of the cutting point 13 through the hollow center 19. Further, since the cutting point 13 is offset sideways from the axial line of rotation of the cutter 8 and the cutter 8 as a whole turns about this axial line as the frame 1 moves, when the frame 1 is slid and moved on film by the hand, a cutting edge extending obliquely upward from the cutting point 13 always faces in the advancing direction of the frame; thus the cutting work can be performed accurately and easily.

Figure 3:
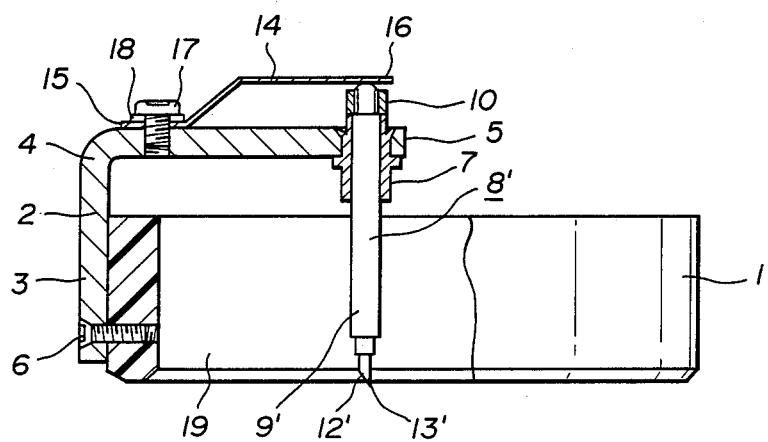
Figure 2:
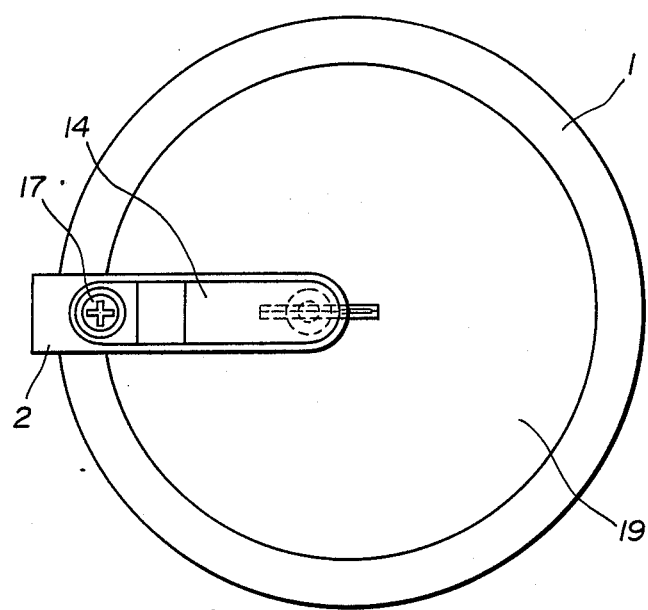
Figure 4:
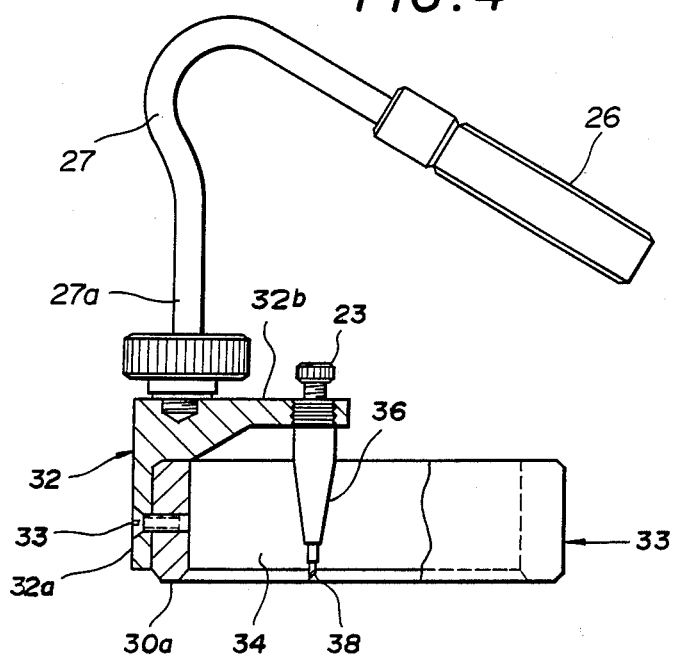
Figure 5:
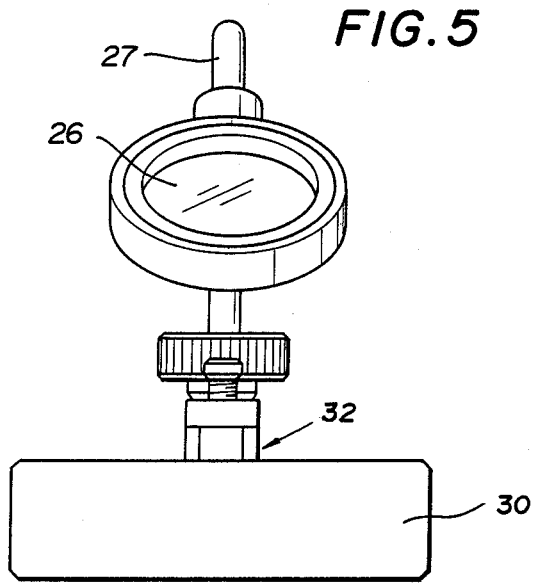

Another embodiment shown in FIG. 3 is identical in configuration with the embodiment of FIG. 1 except for the general configuration of the cutter 8', that is, this cutter 8' is simplified in that a small blade piece 12' is directly held at the lower end of a supporting shaft 9' rotatably supported by the bearing 7. The cutting point 13' of the blade piece 12', similarly to the case of the embodiment of FIG. 1, is slightly offset sideways from the axis of rotation of the cutter 8' which is the central axis of the supporting shaft 9'; hence, this embodiment provides the same function and effect as those of the embodiment of FIG. 30.

A second embodiment shown in FIGS. 4 through 7 is an improved cutting device which is provided with means for adjusting the pressing force of the cutter and a lens for facilitating clear observation of the work.

Figures 7A, 7B:
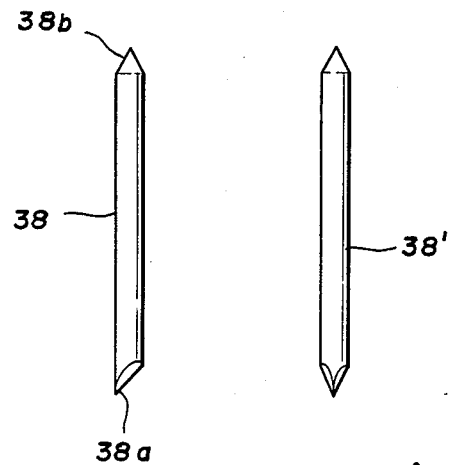

In these drawings, reference numeral 30 designates a frame of hollow cylindrical shape which has a lower flat sliding surface 30a, the outer periphery of this frame 30 of about 6 cm in outer diameter holds an inverted L-shaped supporting arm 32 made of aluminum whose base end portion 32a is secured to its one side by a setscrew 33. A distal end portion 2b of this arm 32 extends to above the central area of the hollow portion 34 of the frame 30, and this distal end portion 32b has a cutter holder 36 secured thereto, which has its axis of rotation orthogonal to the lower sliding surface 30a of the frame 30 and holds a cutter 38 having a cutting surface with an inclined cutting point 38a as shown in FIG. 7a.

Figure 6:
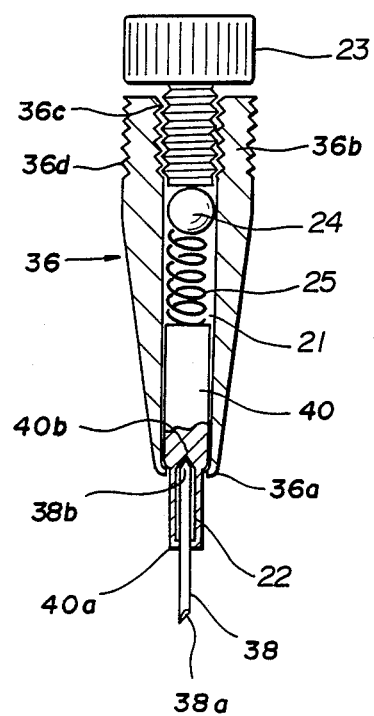
Figure 7C:

As shown in FIG. 6, the cutter supporting member 36 has a cutter supporting shaft 40 which is vertically slidable in a hollow shaft hole 21 but is prevented from falling out by an inwardly flared distal end portion 36a. This cutter supporting shaft 40 has a hollow portion 22 in its lower section; this hollow portion has a receiving portion 40a for the cutter 38 at its lower end and another receiving portion 38b for receiving an upper pointed portion 38b of the cutter 38. Specifically, an upper section of the cutter 38 including the pointed portion 38b as shown in FIG. 7 is inserted in the hollow portion 22 and rotatably held therein and is prevented from falling out by grease therein. It should be noted that because the cutter is small in size and light in weight it can turn freely but not fall out by virtue of the adhesive strength of the grease.

Further, the cutter supporting member 36 has a cutter pressing force adjusting screw 23 engaged with a female thread 36c formed in the hollow shaft hole 21 of its upper section 36b, by which the downward force of the cutter supporting shaft 9 or the cutter 8 via a ball bearing 24 and a coiled spring 25 can be adjusted. It should be noted that the ball bearing is provided for the purpose of preventing the turn of the adjusting screw 23 from acting on the coiled spring.

The cutter supporting member 36 has a male thread 36d formed on the outer periphery of the upper section 36b, by which the cutter supporting member 36 is fitted and secured to the distal end portion 32b of the cutter supporting arm 32.

Further, secured by adequate means to a curved is a base portion 27a of a curvature-adjustable supporting rod 27 which has a magnifying lens 26 attached to its distal end. This supporting rod is made of soft aluminum, lead or the like so that it can be bent into a desired shape to change the position of the lens as required.

Thus, in this configured cutting device, since the cutting point of the cutter is offset sideways from the axis of rotation of the cutter as shown, as the frame 30 is slid and moved by the hand, the cutter 8 turns about that axis in response to the moving of the frame so that the cutting surface of the cutter will always face in the advancing direction of the frame. Further, according to this embodiment, since the cutter supporting shaft 40 is biased by the coiled spring by a force determined by adjusting screw 23 and is rotatably held in the hollow portion 22 of the cutter supporting shaft, the pressure of the cutting point can be adjusted without influence on the turning of the cutter. Further, since the magnifying lens is attached to the distal end of the bendable supporting rod whose base portion is secured to the cutter supporting arm, it is possible to fully view a picture to be masked and the movement of the cutting point, whereby the cutting work can be achieved satisfactorily.

As described above, according to the present invention, the cutting work can be conducted by simply placing the cutting device on the mask film, the cutting process can be carried out with the same conditions in all directions with a set pressing force established through resilient means. The cutting can be advanced smoothly in all directions because the supporting shaft serving as the mandrel of the cutter is always kept vertical.

Further, as illustrated in connection with the first embodiment, a ready-made cutter element can be employed as the blade piece, thus saving costs. Further, according to the present invention, since the cutter is pressed via the coiled spring by the adjusting screw provided in the upper section of the cutter supporting member, the pressing force acting on the cutting point can be adjusted without inhibiting the turning action of the cutter, and the magnifying lens can be positioned such that the worker can clearly view the cutting point and the original photo.

Therefore, the use of the device of the present invention avoids the possibility that excessive force might damage the cutting edge. Such damage might result if the work is performed with the cutter directly supported by hand, and another possibility is that the cutting might be inaccurate. Such problems result if the blade piece is not kept vertical. However, with the present invention the cutting of a mask can be achieved easily and accurately with no need for any skill.

Thus, there is provided in accordance with the present invention a cutting device which has the advantages discussed above. The embodiments described above are intended to be merely exemplary and those skilled in the art will be able to make variations and modifications of them without departing from the spirit and scope of the invention. All such modifications and variations are contemplated as falling within the scope of the claims.

What is claimed is:

1. A cutting device for cutting a mask comprising:
    a hollow cylindrical frame defining a central opening and having a lower flat sliding surface;
    a supporting arm secured to the frame and having a distal end positioned over said central opening;
    an elongated cutter including a cutter support secured to said distal end of said supporting arm, a cutter shaft rotatably supported by said cutter support, said cutter shaft having a longitudinal axis of rotation perpendicular to the lower sliding surface;
    resilient means for bearing against said cutter shaft to bias said cutter shaft vertically downward; and a cutting element secured to said lower end of said cutter shaft, said cutting element having a cutting point offset from said axis of rotation.

2. A cutting device according to claim 1, further comprising, mounted on said supporting arm, a curvature-adjustable supporting rod having a magnifying lens attached to its distal end for magnifying an area around the cutting point.

3. A cutting device according to claim 1, wherein said resilient means is a spring plate attached at one end to said supporting arm and having a distal end bearing against the upper end of said cutter shaft.

4. A cutting device according to claim 1 wherein said cutter support has a central bore, a lower end portion and an upper end portion and said resilient means is a helical spring mounted within said central bore, said cutter shaft having an upper end rotatably held within said central bore and bearing against a lower end of said helical spring; and wherein said cutter further includes adjustment means for adjusting the amount of compression within said helical spring.

5. The cutting device of claim 4 wherein said cutter support has internal threads within its upper end portion and wherein said adjustment means is a bolt threaded within said upper end portion and bearing against the upper end of said helical spring.

6. The cutting device of claim 5 further comprising a ball bearing mounted in said central bore, interposed between said adjustment means and said helical spring.

7. A cutting device according to claim 1 further comprising a pair of cutting element supporting plates mounted on the lower end of said cutter shaft and a set screw for tightening said supporting plates together against a cutting element, in the form of a cutting blade, held therebetween.

* * * * *

UNITED STATES PATENT AND TRADEMARK OFFICE
CERTIFICATE OF CORRECTION

PATENT NO. : 4,934,054
DATED : June 19, 1990
INVENTOR(S) : MOROZUMI

It is certified that error appears in the above-identified patent and that said Letters Patent is hereby corrected as shown below:

Col. 1, line 49, after "arm" insert --or--.
Col. 2, line 18, after "bearing" insert --7--.
Col. 3, line 12, "30" should read --1--;
 line 38, "38b" should read --40b--; and
 line 61, delete "by adequate means to a curved" and insert --to arm 32--.
Col. 4, line 14, delete "a" and insert --the--;
 line 20, delete ", the cutting" and insert --and--; and
 line 21, delete "process".

Signed and Sealed this

First Day of October, 1991

Attest:

HARRY F. MANBECK, JR.

Attesting Officer

Commissioner of Patents and Trademarks